(12) United States Patent
Suzuki

(10) Patent No.: US 8,008,204 B2
(45) Date of Patent: Aug. 30, 2011

(54) METHOD OF MANUFACTURING SEMICONDUCTOR DEVICE

(75) Inventor: Tatsuya Suzuki, Kawasaki-Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 757 days.

(21) Appl. No.: 11/859,573

(22) Filed: Sep. 21, 2007

(65) Prior Publication Data

US 2008/0206947 A1 Aug. 28, 2008

(30) Foreign Application Priority Data

Sep. 22, 2006 (JP) .................................. 2006-256761

(51) Int. Cl.
*H01L 21/311* (2006.01)

(52) U.S. Cl. . 438/696; 438/762; 438/763; 257/E21.626; 257/E21.64

(58) Field of Classification Search .................. 438/265, 438/275, 762, 768, 770, 696, 303, 763, FOR. 203; 257/E21.626, E21.64, E21.038
See application file for complete search history.

(56) References Cited

U.S. PATENT DOCUMENTS

| 5,998,288 | A * | 12/1999 | Gardner et al. | 438/589 |
|---|---|---|---|---|
| 6,743,689 | B1 * | 6/2004 | Paton et al. | 438/305 |
| 7,307,026 | B2 * | 12/2007 | Streck et al. | 438/746 |
| 2002/0109196 | A1 * | 8/2002 | Fujisawa et al. | 257/384 |
| 2005/0093075 | A1 * | 5/2005 | Bentum et al. | 257/368 |
| 2005/0202643 | A1 * | 9/2005 | Lee et al. | 438/303 |

FOREIGN PATENT DOCUMENTS

| JP | 07211690 | 11/1995 |
|---|---|---|
| JP | 2003258248 | 12/2003 |

* cited by examiner

*Primary Examiner* — Matthew Smith
*Assistant Examiner* — Quovaunda Jefferson
(74) *Attorney, Agent, or Firm* — Young & Thompson

(57) ABSTRACT

A method of manufacturing the semiconductor device is provided, which provides a prevention for a "dug" of a silicon substrate caused by the etching in regions except a region for forming a film during a removal of the film with a chemical solution. A method of manufacturing a semiconductor device according to an embodiment of the present invention includes forming a first silicon oxide film on a surface of a silicon substrate or on a surface of a gate electrode when a silicon nitride film for a dummy side wall is etched off, to provide a protection for such surfaces, and then etching a portion of the silicon nitride film with a chemical solution, and then a second oxide film for supplementing a simultaneously-etched portion of the first silicon oxide film is formed, and eventually performing an etching for completely removing the silicon nitride film for the dummy side wall.

10 Claims, 12 Drawing Sheets

METHOD OF MANUFACTURING SEMICONDUCTOR DEVICE

This application is based on Japanese patent application No. 2006-256,761, the content of which is incorporated hereinto by reference.

BACKGROUND

1. Technical Field

The present invention relates to a method of manufacturing a semiconductor device.

2. Related Art

In formation of 45 nm node-level fine transistors, a process for doping extension impurities and/or an another activation heat process are often performed after a doping of a source drain impurity and activation heat process for inhibiting a short-channel effect. This is because higher temperature for the activation heat process with the source drain impurity causes a non-negligible diffusion of the extension impurity. A process for performing a formation of an extension after forming such source-drain involves forming a dummy side wall with a silicon nitride film, doping and activating a source drain impurity, and then removing the silicon nitride film by an etch process with phosphoric acid.

When the silicon nitride film serving as the dummy side wall is removed by an etching with phosphoric acid, only a chemically oxidized film having a thickness of about 1 nm formed during a preceding cleaning operation is present on a gate polysilicon electrode and on a portion of a substrate corresponding to a source-drain region, serving as an exposed surface of silicon. Thus, particularly in a case of a target etch removal for silicon nitride film of several tens nanometer, the chemically oxidized film could often be completely removed in some etch process due to a selectivity for silicon nitride film/oxide film, resulting in that phosphoric acid is directly in contact with the surfaces of the silicon substrate and gate polysilicon electrodes. Since phosphoric acid has a property of etching silicon, a silicon substrate or a gate polysilicon electrode is etched as a consequence. Hereinafter such phenomenon of unwanted etching is referred to as "substrate-dug". Influences of such substrate-dug for a silicon substrate are particularly serious, and once such substrate-dug is caused in a source-drain region, an issue of increasing a junction leakage due to a decreased distance between a silicide and a junction may be caused.

On the other hand, a processing for forming a gate electrode in a 45 nm node-level fine transistor is often performed by employing a hard mask of a silicon nitride film or the like. The process employing a hard mask is more preferable than a process employing a resist mask, because a process employing a resist mask for such fine transistor, which has an extremely small gate length (dimension of electrode in a direction toward a drain from a source: L-dimension), may cause a disappearance or a deform of the gate electrode, deteriorating a processing geometry. A process of removing with phosphoric acid after the gate electrode is processed is required if a hard mask of a silicon nitride film is employed, and in such case, a similar problem as caused in the above-described removal of the dummy side wall is also caused. More specifically, the silicon substrate and/or the gate polysilicon electrode are etched. In such case, even if a substrate-dug is caused just after the gate electrode is processed, such process provides a geometry, in which the level of the surface of the source-drain region is lower than the level of the interface between the gate insulating film and the substrate, causing a deeper junction depth eventually formed therein, decreasing a minimum gate length (Lmin), which provides a tolerance for a threshold voltage (Vth) in an operation of a transistor. More specifically, minimum gate length (Lmin) is a maximum value of gate length (L dimension), which provides a slope of a plot in a graph having ordinate of threshold voltage (Vth) of transistor and abscissa of gate length (L) of not smaller than a predetermined allowed value (for example, 10 V/μm), and a transistor having smaller Lmin achieves an operation in finer region.

Typical conventional technology for solving the above-described issue is disclosed in Japanese Patent Laid-Open No. H07-211,690 (1995), in which a process for removing a silicon nitride film in a formation of an element isolation while forming an oxide film on an exposed surface of silicon by employing a hydrogen peroxide water containing phosphoric acid. In addition, Japanese Patent Laid-Open No. 2003-258,248 disclose a process as shown in FIG. 12, in which a dummy side wall 22 is once formed and then a source-drain region 23 is formed, and thereafter the dummy side wall 22 is removed to expand the source-drain region 23. For this, the dummy side wall 22 is removed after forming a protective oxide film 38 on principal surfaces of the gate electrode 21 and the source-drain region 23.

However, the above-described processes leave much to be improved. Since the removal of the silicon nitride film and the formation of the oxide film on the exposed surface of silicon are simultaneously carried out in the process described in Japanese Patent Laid-Open No. H07-211,690, it is impossible to form a chemically oxidized film having sufficient quality for preventing the substrate-dug with phosphoric acid. Thus, it is difficult to obtain a semiconductor device having a desired geometry.

On the other hand, the process described in Japanese Patent Laid-Open No. 2003-258,248 includes that, in the formation of a protective oxide film on the source-drain region of on the gate electrode, the oxide film is formed by a dry process. However, a thermal processing such as the dry oxidization described therein generally causes a deeper junction depth in the source-drain region due to a diffusion of an impurity, and on the other hand an impurity causes redistributing in the gate polysilicon electrode, migrating through the gate insulating film, thereby causing inhomogeneous channel impurity concentration, and therefore it is difficult to obtain a desired electrical characteristic by such process.

SUMMARY

In one embodiment, there is provided a method of manufacturing a semiconductor device, comprising: forming a first film on a first region in a substrate composed of silicon; forming a first silicon oxide film on a second region being different from said first region in said substrate by oxidizing said substrate; removing at least portions of the first film and the first silicon oxide film by contacting the first film and the first silicon oxide film with a first chemical solution; forming a second silicon oxide film by oxidizing the substrate in the second region; and removing the first film and the second silicon oxide film by contacting the first film and the second silicon oxide film with a second chemical solution.

In another embodiment, there is provided a method of manufacturing a semiconductor device, comprising: forming a gate electrode composed of polysilicon on a silicon substrate; forming a side wall composed of a first film on both side surfaces of the gate electrode; forming an impurity-diffused region on the silicon substrate in both sides of the side wall; and removing the side wall, wherein the removing the side wall includes: forming a first silicon oxide film by oxidizing silicon constituting an upper surface of the impurity-diffused region and silicon constituting an upper surface of the gate electrode; contacting the entire surface of the silicon substrate with a first chemical solution to remove at least portions of the first film and the first silicon oxide film; forming a second silicon oxide film by oxidizing silicon constituting an upper surface of the impurity-diffused region and silicon constituting an upper surface of the gate electrode; and contacting the entire surface of the silicon substrate with a second chemical solution to remove the first film and the second silicon oxide film.

In another embodiment, there is provided a method of manufacturing a semiconductor device, comprising: forming a gate insulating film and a gate electrode film composed of polysilicon on a silicon substrate in this sequence, and forming a hard mask composed of a first film on the gate electrode film; selectively etching the gate insulating film and the gate electrode film by employing the hard mask to form a gate electrode; and removing the hard mask, wherein the removing the hard mask includes forming a first silicon oxide film by oxidizing silicon constituting upper surfaces of regions except the gate electrode and silicon constituting a side surface of the gate electrode; contacting the entire surface of the silicon substrate with a first chemical solution to remove at least portions of the first film and the first silicon oxide film; forming a second silicon oxide film by oxidizing silicon constituting upper surfaces of regions except the gate electrode and silicon constituting a side surface of the gate electrode; and contacting the entire surface of the silicon substrate with a second chemical solution to remove the first film and the second silicon oxide film.

According to the present invention, the regions except the region for forming the films are protected by the first silicon oxide film when the films are removed by a predetermined chemical solution, and the second silicon oxide film is formed before the first silicon oxide film is completely etched off with the above-described chemical solution, so that a substrate-dug caused by the chemical solution can be inhibited. As a result, in the process involving, for example, forming the gate electrode and forming an impurity-diffused region through a mask of the side wall and then removing the side wall, the first silicon oxide film and the second silicon oxide film are formed on the upper surface of the gate electrode and/or on the upper surface of the impurity-diffused region to provide a prevention for the substrate-dug, so that predetermined geometries of the gate electrode and the impurity-diffused region can be formed. In addition, in another process involving processing the electrode into the gate electrode geometry by employing a hard mask and then removing the hard mask, the first silicon oxide film and the second silicon oxide film are formed on the side surface of the gate electrode and/or on the silicon substrate to provide a prevention for the substrate-dug, thereby achieving a formation of the into a predetermined geometry. In addition, according to the method of manufacturing the semiconductor device of the present invention, a need for implementing a heat treatment at a higher temperature by a dry oxidization as described in Japanese Patent Laid-Open No. 2003-258,248 can be avoided, allowing a prevention for a diffusion due to a thermal processing for an impurity.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

Figure 1A:
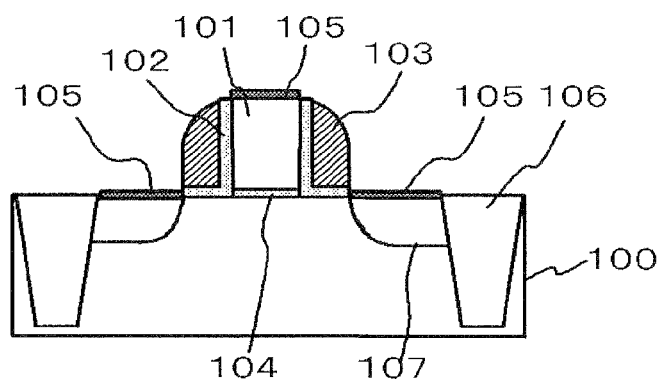
FIGS. 1A to 1D are cross-sectional views, sequentially showing a process for manufacturing a semiconductor device in first embodiment of the present invention.

The invention will be now described herein with reference to illustrative embodiments. Those skilled in the art will recognize that many alternative embodiments can be accomplished using, the teachings of the present invention and that the invention is not limited to the embodiments illustrated for explanatory purposed.

Preferable exemplary implementations of methods for manufacturing semiconductor devices according to the present invention will be described in reference to the annexed figures. In all figures, identical numeral is assigned to an element commonly appeared in the description of the present invention in reference to the figures, and the detailed description thereof will not be repeated.

A method of manufacturing a semiconductor device according to the present invention generally includes the following process operations of:

(a) forming a first film on a first region in a substrate composed of silicon and forming a first silicon oxide film on a second region in the substrate by oxidizing the substrate, the second region being different from the first region;

(b) removing at least portions of the first film and the first silicon oxide film by contacting the first film and the first silicon oxide film with a first chemical solution;

(c) forming a second silicon oxide film by oxidizing the substrate in the second region; and (d) removing the first film and the second silicon oxide film by contacting the first film and the second silicon oxide film with a second chemical solution.

Here, the above-described first film may be a film containing nitrogen. In addition, the above-described first chemical solution and the second chemical solution may be phosphoric acid aqueous solution. In addition to above, the first chemical solution and the second chemical solution may be the same chemical solution or may be different type chemical solutions.

In addition, the above-described first silicon oxide film may be preferably formed by a rapid thermal oxidation process at a temperature within a range of from 600 degree C. to 800 degree C. or a rinsing process. In addition, the second silicon oxide film may be preferably formed by employing a chemical solution containing one selected from a group consisting of sulfuric acid hydrogen peroxide mixture (SPM), sulfuric acid ozone mixture (SOM: $H_2SO_4/O_3$) and ozone water. Further, the second silicon oxide film may be preferably formed by a rapid thermal oxidation process at a temperature within a range of from 600 degree C. to 800 degree C.

Here, the above-described first silicon oxide film may be removed by the above-described first chemical solution, or alternatively the film thickness of the silicon oxide film may be reduced until the silicon oxide film is partially remained. This allows protecting the above-described second region, so that a substrate-dug can be inhibited. In addition, the above-described second silicon oxide film may be removed with the above-described second chemical solution, or alternatively the film thickness of the silicon oxide film may be reduced until the silicon oxide film is partially remained.

In addition to above, the second silicon oxide film may also serves as a continuous silicon oxide film formed by increasing the total film thickness with the first silicon oxide film.

The method of manufacturing the semiconductor device according to the first and second embodiments will be described as follows.

First Embodiment

In the present embodiment, an exemplary implementation of removing a dummy side wall formed on a side surface of a gate electrode and serving as a mask for doping an impurity to form a source-drain region after doping the impurity will be described.

FIGS. 1A to 1D and FIGS. 2A to 2D are cross-sectional views, sequentially showing a process for manufacturing a semiconductor device in first embodiment of the present invention.

First of all, as shown in FIG. 1A, a gate insulating film 104 and a gate electrode 101 composed of polysilicon are formed on a silicon substrate 100 having an oxide film 106 for element isolation formed thereon, and then a dummy side wall 103 (first film) is formed on both side surfaces of the gate electrode 101 through a dummy oxide film 102 therebetween, and further an ion-implanting is performed on both sides of the dummy side wall 103 and an activation annealing is performed to form the source-drain region 107. The dummy side wall 103 is formed of, for example, a film containing nitrogen. A silicon nitride film is employed in the present embodiment.

Here, a surface layer of the source-drain region 107 may be in a condition, in which some dopants like phosphorus are ion-implanted and excited, or in a condition, in which silicon-germanium (SiGe) is preliminarily in epitaxially grown. When the process of the present invention is applied under such conditions, advantageous effects of the present invention are more considerably exhibited.

Next, silicon in a surface layer of the source-drain region 107 and silicon in a surface of the polysilicon of gate electrode 101 are oxidized to form the first silicon oxide film 105. Here, the first silicon oxide film 105 is formed to have a thickness of about 1 to 1.5 nm at a relatively lower temperature within a range of from 600 degree C. to 800 degree C. by a thermal process such as a rapid thermal oxidation and the like. In addition to above, such first silicon oxide film 105 may alternatively be a chemically oxidized film formed during a rinsing process. Further, instead of the oxide film thus actively formed as shown in FIG. 1A, the chemically oxidized film formed in the previous processing for rinsing may alternatively be employed.

Figure 1B:
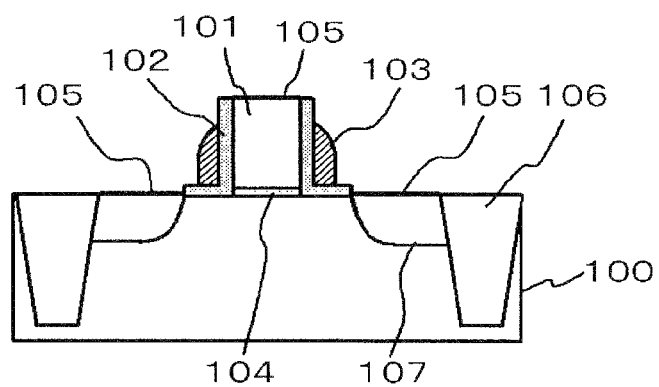

Thereafter, the entire surface of the silicon substrate 100 is brought into contact with the first chemical solution (FIG. 1B). The first chemical solution is, for example, phosphoric acid aqueous solution. This allows etching the silicon nitride film on the dummy side wall 103. An etch amount for the silicon nitride film here may be equivalent to etching for about 40 nm thick. On the other hand, since an etch selectivity for silicon nitride/silicon oxide film with phosphoric acid aqueous solution is about 40, the first silicon oxide film 105 is also etched for about 1.0 nm with phosphoric acid aqueous solution. As a result, the first silicon oxide film 105 may be removed, or partially remained with a thickness of equal to or smaller than 0.5 nm.

Figure 1C:
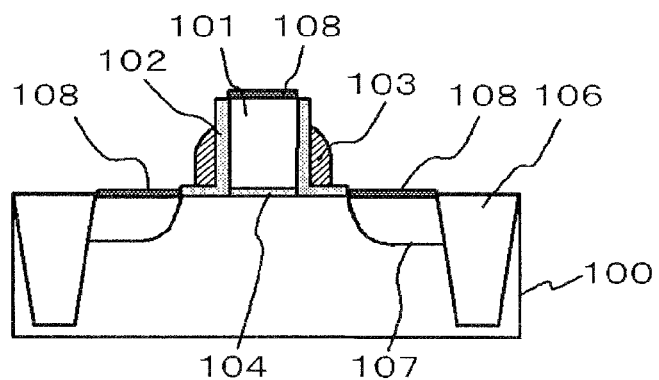

Next, the upper surface of the source-drain region 107 and the upper surface of the gate electrode 101 are oxidized to form the second silicon oxide film 108 (FIG. 1C). The second silicon oxide film 108 is formed to a thickness of about 1 to 1.5 nm by a rapid thermal oxidation process at a temperature within a range of from 600 degree C. to 800 degree C. Alternatively, the chemically oxidized film may be re-grown to a thickness of about 1 nm by a rinsing processing by employing a chemical solution containing one selected from a group consisting of SPM, $H_2SO_4/O_3$ and ozone water. By forming the chemically oxidized film by a rinsing processing by employing a chemical solution containing one selected from a group consisting of SPM, $H_2SO_4/O_3$ and ozone water, a high quality silicon oxide film having a fine oxide film quality can be formed, so that a sufficient etching allowance can be assured. Here, if the first silicon oxide film 105 is remained before forming the second silicon oxide film 108, the second silicon oxide film 108 forms a silicon oxide film, which is formed as a continuous body that also includes the first silicon oxide film 105.

Figure 1D:
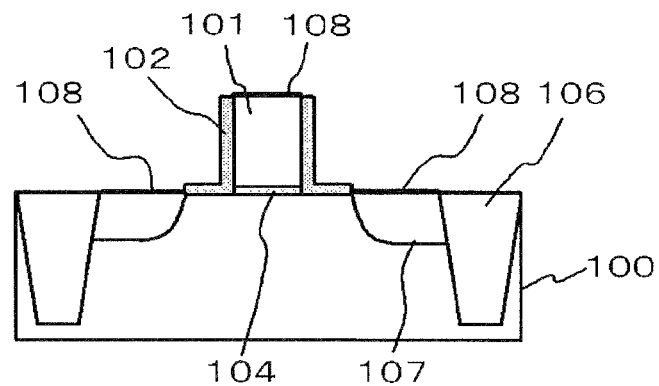

Further, the entire surface of the silicon substrate 100 is brought into contact with the second chemical solution to etch the dummy side wall 103, thereby completely removing the silicon nitride film (FIG. 1D). Here, the second chemical solution may be phosphoric acid aqueous solution. This allows etching the silicon nitride film that has been remained by the above-mentioned etching of the silicon nitride film for an amount equivalent to etching for about 40 nm thick. In such case, the second silicon oxide film 108 is also etched for about 1.0 nm the end of the etching, and as a result, the second silicon oxide film 108 may be removed, or partially remained with a thickness of equal to or smaller than 0.5 nm. In other words, even if the silicon substrate 100 or the surface of the gate electrode 101 is exposed after two cycles of the processing with phosphoric acid aqueous solution, an over-etching can be avoided. Alternatively, the second silicon oxide film 108 may alternatively be remained. As a result, no "dug" is caused in the silicon substrate 100 or the gate electrode 101.

Figure 2A:
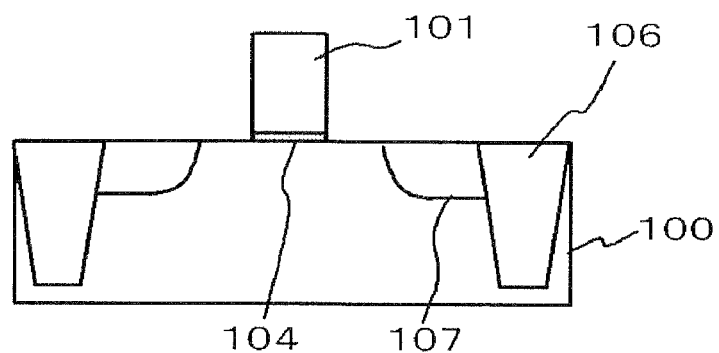
FIGS. 2A to 2D are cross-sectional views, sequentially showing the process for manufacturing the semiconductor device in first embodiment of the present invention.
Figure 2B:
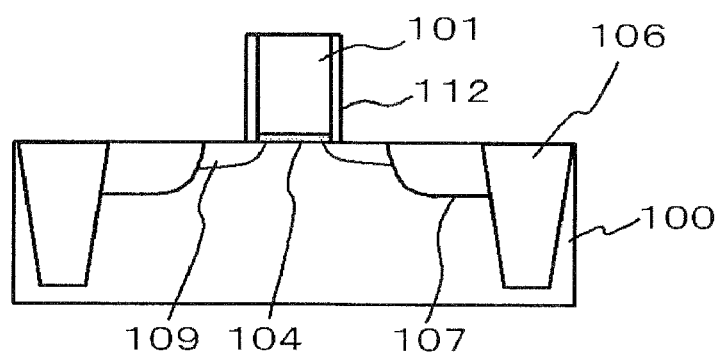
Figure 2C:
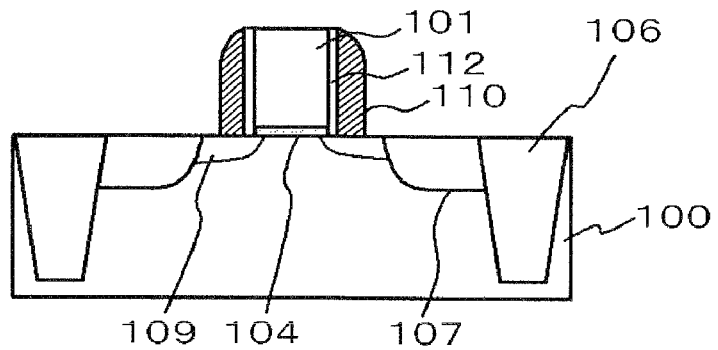

After performing the above-described process, as shown in FIGS. 2A and 2B, the dummy oxide film 102 underlying the silicon nitride film is etched with diluted hydrofluoric acid (FIG. 2A), and then an offset spacer 112 is formed with an oxide film or the like (FIG. 2B), and further a doping with an extension impurity and an annealing are performed to form an extension region 109.

Figure 2D:
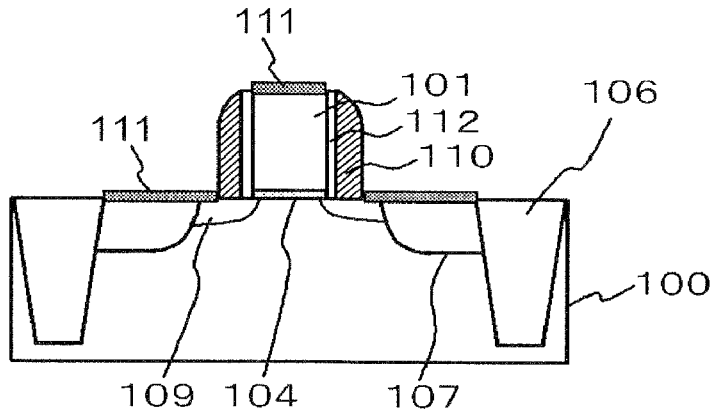

Further, a side wall 110 is formed with a silicon nitride film or the like (FIG. 2C), and then, a silicide 111 is formed to obtain a structure as shown in FIG. 2D.

Next, advantageous effects of the present embodiment will be described.

In the method of manufacturing the semiconductor device as described in reference to FIGS. 1A to 1D and FIGS. 2A to 2D, the first silicon oxide film 105 is first formed on the surfaces of the silicon substrate 100 when the silicon nitride film composing the dummy side wall 103 is etched off, and the gate electrode 101 to provide protections to the surfaces of the silicon substrate 100 and the gate electrode 101, and then a portion of the silicon nitride film is etched with phosphoric acid aqueous solution. Since the film thickness of the first silicon oxide film 105, which has been etched simultaneously in this occasion, is decreased, the etching of the silicon nitride film while maintaining such condition causes an exposure of the silicon substrate 100. In order to supplement the film thickness of such silicon oxide film 105, the second silicon oxide film 108 is formed, and then the etching for completely removing the silicon nitride film composing the dummy side wall 103 is performed. This allows preventing the "dug" of the silicon substrate 100 or the gate electrode 101 after the removal of the silicon nitride film, without exposing the surfaces of the silicon substrate 100 and the gate electrode 101 over phosphoric acid aqueous solution. Thus, a better configuration for increasing the junction leakage or inhibiting the deterioration of Lmin can be achieved, since the desired geometries of the gate electrode 101 and the source-drain region 107 can be obtained by employing such configuration.

Further, advantageous effects of the present embodiment will be described in detail, in comparison with a process for etching the silicon nitride film composing the dummy side wall 103 off without taking any countermeasures for preventing the "dug" of the silicon substrate 100 or the gate electrode 101.

Figure 3A:
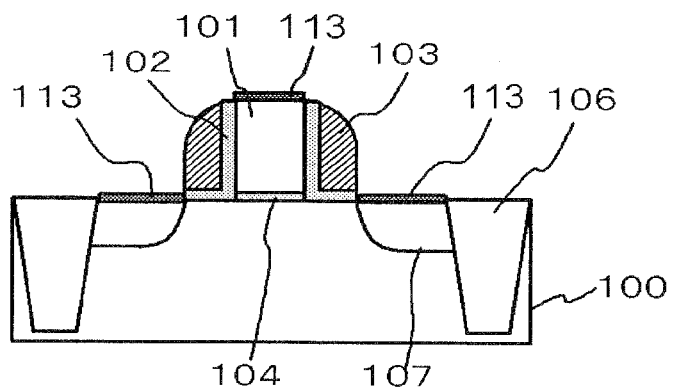
FIGS. 3A to 3D are cross-sectional views, sequentially showing a conventional process for manufacturing the semiconductor device.
Figure 3B:
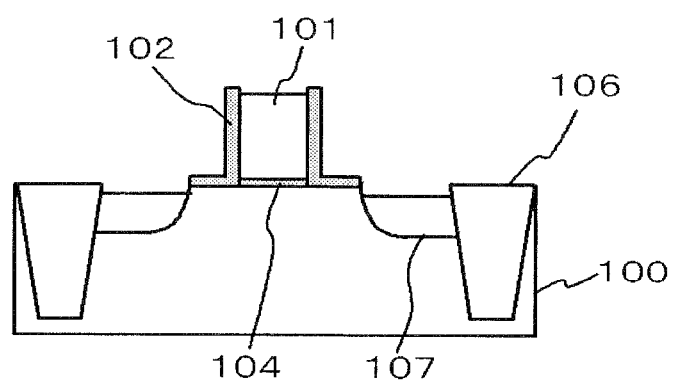
Figure 3C:
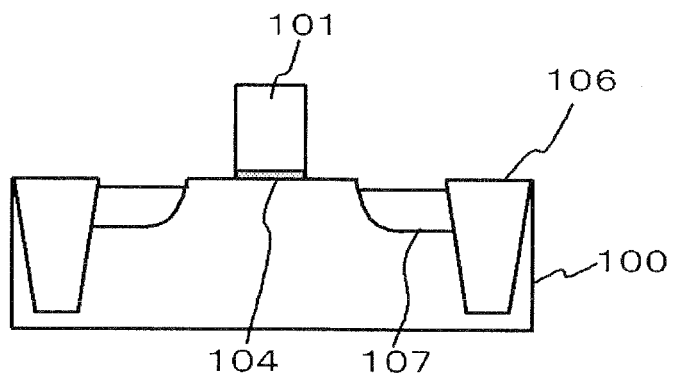
Figure 3D:
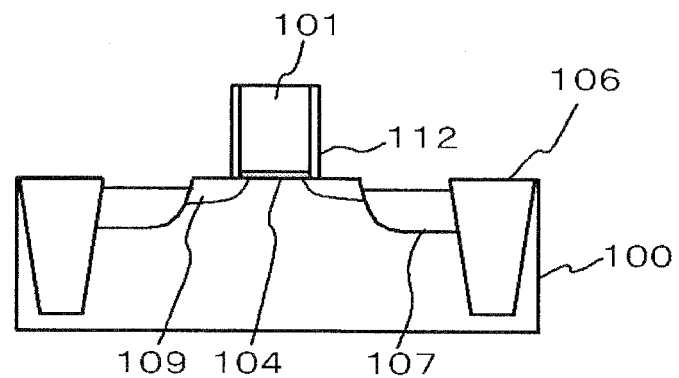
Figure 4A:
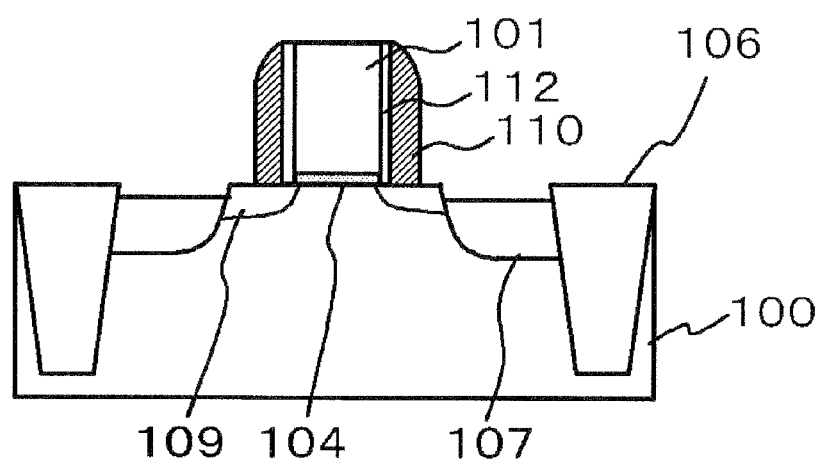
FIGS. 4A to 4B are cross-sectional views, sequentially showing the conventional process for manufacturing the semiconductor device.
Figure 4B:
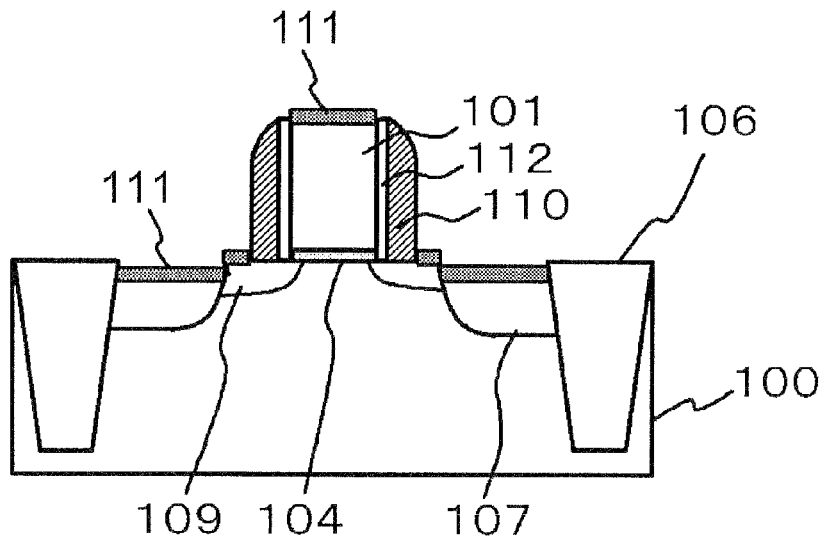

FIGS. 3A to 3D and FIGS. 4A and 4B are cross-sectional views, illustrating an etching process for the silicon nitride film composing the dummy side wall 103 with an etching amount equivalent to 80 nm by only one cycle of a phosphate processing, without forming the first silicon oxide film and the second silicon oxide film. A one cycle of the etching of the silicon nitride film composing the dummy side wall 103 provides an etching of the silicon oxide film 113 by the etching amount equivalent to 2.0 nm, as a selectivity for silicon nitride film/oxide film is about 40. As shown in FIG. 3A, since the source-drain region 107 and the silicon oxide film 113 on the upper surface of the gate electrode 101 are chemically oxidized film or a native oxide film formed in the previous rinsing process, these films have a smaller thickness of about 1 nm, and therefore phosphoric acid aqueous solution is completely penetrated through the silicon oxide film 113. More specifically, since the silicon substrate 100 and the gate electrode 101 are exposed to phosphoric acid and a considerable over-etch is caused, the silicon substrate 100 and the gate electrode 101 are dug by the etching (FIG. 3B). Under such condition, the dummy oxide film 102 is removed (FIG. 3C), and then the offset spacer 112 is formed (FIG. 3D), and the extension region 109 is formed by an annealing process for ion implantation and activation. Further, the side wall 110 is formed (FIG. 4A), and then the silicide 111 is successively formed to provide a cross sectional structure as shown in FIG. 4B. Thus, since the distance between the junction of the silicide 111 and the source-drain region 107 is decreased, there is a fear of unwanted increase of a junction leakage.

On the contrary, since the surfaces of the silicon substrate 100 and the gate electrode 101 are protected with the first silicon oxide film 105 and the second silicon oxide film 108 until the silicon nitride film is completely etched off with phosphoric acid aqueous solution in the present embodiment, the "dug" in the surfaces of the silicon substrate 100 and the gate electrode 101 can be prevented.

Further, the first silicon oxide film 105 and the second silicon oxide film 108 are formed by a rapid thermal oxidation process at a temperature within a range of from 600 degree C. to 800 degree C. and function as inhibiting a diffusion of an impurity into the source-drain region 107. Alternatively, when the second silicon oxide film 108 is formed by using a chemical solution containing one selected from a group consisting of SPM, $H_2SO_4/O_3$ and ozone water, a high quality silicon oxide film having a fine oxide film quality can be formed, so that a sufficient etching allowance can be assured.

Second Embodiment

In the present embodiment, an exemplary implementation for removing a hard mask during the processing of the gate electrode will be described.

FIGS. 5A to 5D are cross-sectional views, sequentially showing a process for manufacturing a semiconductor device in second embodiment of the present invention. A gate electrode film composed of a gate insulating film 204 and a polysilicon is deposited on a silicon substrate 200 having an oxide film 206 for element isolation formed thereon, and a hard mask 203 (first film) having a geometry equivalent to a gate electrode geometry is formed on the gate electrode film. The gate electrode film and the gate insulating film 204 are etched to form a gate electrode 201. Here, the hard mask 203 is formed of a film containing nitrogen. More specifically, the film is a silicon nitride film.

Figure 5A:
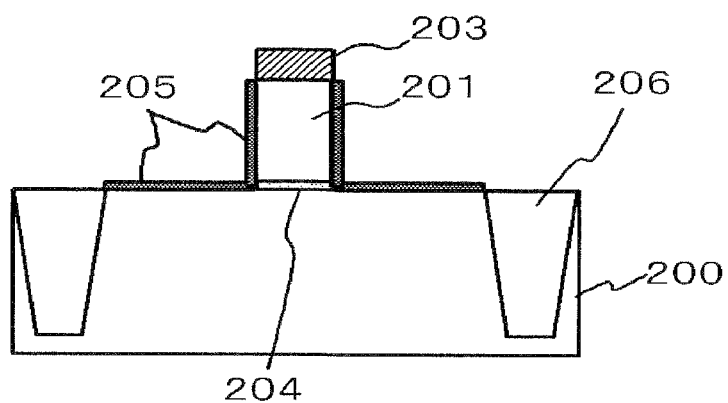
FIGS. 5A to 5D are cross-sectional views, sequentially showing a process for manufacturing a semiconductor device in second embodiment of the present invention.

Next, polysilicon on both side surfaces of the silicon substrate 200 and the gate electrode 201 are oxidized to form the first silicon oxide film 205 (FIG. 5A). Here, the first silicon oxide film 205 is formed to have a thickness of about 1 to 1.5 nm at a relatively lower temperature within a range of from 600 degree C. to 800 degree C. by a thermal process such as a rapid thermal oxidation and the like. In addition to above, such first silicon oxide film 205 may alternatively be a chemically oxidized film formed during a rinsing process. Further, the first silicon oxide film 205 may be composed of the chemically oxidized film formed in the previous wet process, instead of the oxide film thus additionally formed as shown in FIG. 5A.

Figure 5B:
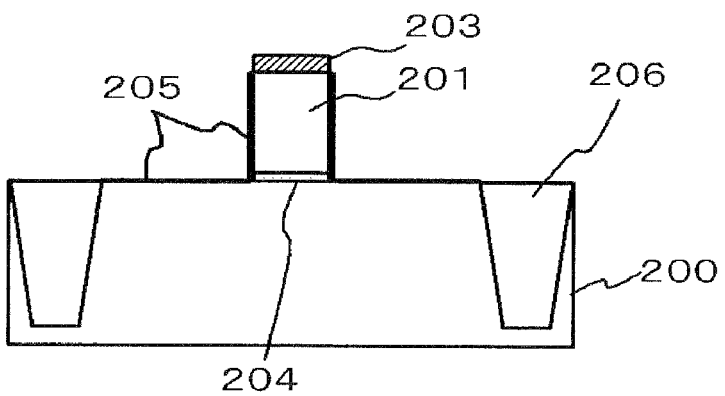

Thereafter, the entire surface of the silicon substrate 200 is brought into contact with the first chemical solution (FIG. 5B). The first chemical solution is, for example, phosphoric acid aqueous solution. This allows etching the silicon nitride film on the hard mask 203. An etch amount for the silicon nitride film here may be equivalent to etching for about 40 nm thick. As described above in relation to first embodiment, due to an etch selectivity for silicon nitride/silicon oxide film, the first silicon oxide film 205 is also etched for about 1.0 nm, and as a result, the first silicon oxide film 205 may be removed, or partially remained with a thickness of equal to or smaller than 0.5 nm.

Figure 5C:
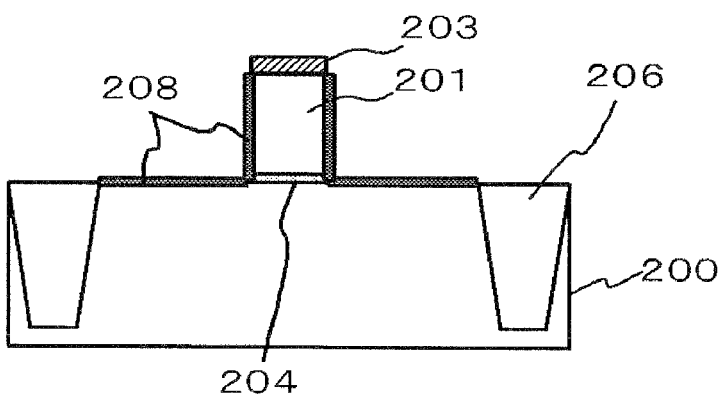

Next, polysilicon on both side surfaces of the silicon substrate 200 and the gate electrode 201 are oxidized to form the second silicon oxide film 208 (FIG. 5C). The second silicon oxide film 208 is formed to a thickness of about 1 to 1.5 nm at a temperature within a range of from 600 degree C. to 800 degree C. of a rapid thermal oxidation process or the like. Alternatively, the chemically oxidized film may be re-grown to a thickness of about 1 nm by employing a chemical solution containing one selected from a group consisting of SPM, $H_2SO_4/O_3$ and ozone water. Here, if the first silicon oxide film 205 is remained before forming the second silicon oxide film 208, the second silicon oxide film 208 forms a silicon oxide film, which is formed as a continuous body that also includes the first silicon oxide film 205.

Figure 5D:
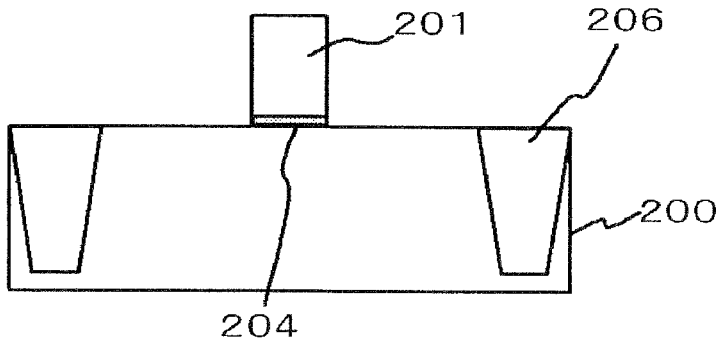

Further, the entire surface of the silicon substrate 200 is brought into contact with the second chemical solution to etch the hard mask 203, thereby completely removing the silicon nitride film (FIG. 5D). Here, the second chemical solution is, for example, phosphoric acid aqueous solution. This allows etching the silicon nitride film that has been remained by the above-mentioned etching of the silicon nitride film for an amount equivalent to etching for about 40 nm thick. In such case, the second silicon oxide film 208 is also etched for about 1.0 nm the end of the etching, and as a result, the second silicon oxide film 208 may be removed, or partially remained with a thickness of equal to or smaller than 0.5 nm. In other words, even if the silicon substrate 200 or the side surface of the gate electrode 201 is exposed after two cycles of the processing with phosphoric acid aqueous solution, an over-etching can be avoided. Alternatively, the second silicon oxide film 208 may alternatively be remained. As a result, no "dug" is caused in the silicon substrate 200 or the gate electrode 201.

Next, advantageous effects of the present embodiment will be described.

In the method of manufacturing the semiconductor device as described in reference to FIGS. 5A to 5D the first silicon oxide film 205 is first formed on the surfaces of the silicon substrate 200 when the silicon nitride film composing the hard mask 203 is etched off, and the gate electrode 201 to provide protections to the silicon substrate 200 and the side wall of the gate electrode 201, and then a portion of the silicon nitride film is etched with phosphoric acid aqueous solution. Since the film thickness of the first oxide film 205, which has been etched simultaneously in this occasion, is decreased, the etching of the silicon nitride film while maintaining such condition causes an exposure of the silicon substrate 200. In order to supplement the film thickness of such first silicon oxide film 205, the second silicon oxide film 208 is formed, and then the etching for completely removing the silicon nitride film composing the hard mask 203 is performed. This allows preventing the "dug" of the silicon substrate 200 or the gate electrode 201 after the removal of the silicon nitride film, without exposing the silicon substrate 200 and the side wall of the gate electrode 201 over phosphoric acid aqueous solution. As a result, a problem of unwanted deeper junction depth of the finally formed junction due to a dimensional variation of the gate electrode 201 or the surface level of the source-drain region that is lower than the interface of the gate insulating film 204/the silicon substrate 200 can be prevented.

Further, advantageous effects of the present embodiment will be described in detail, in comparison with a process for etching the silicon nitride film composing the hard mask 203 off without taking any countermeasures for preventing the "dug" of the silicon substrate 200 or the gate electrode 201.

Figure 6A:
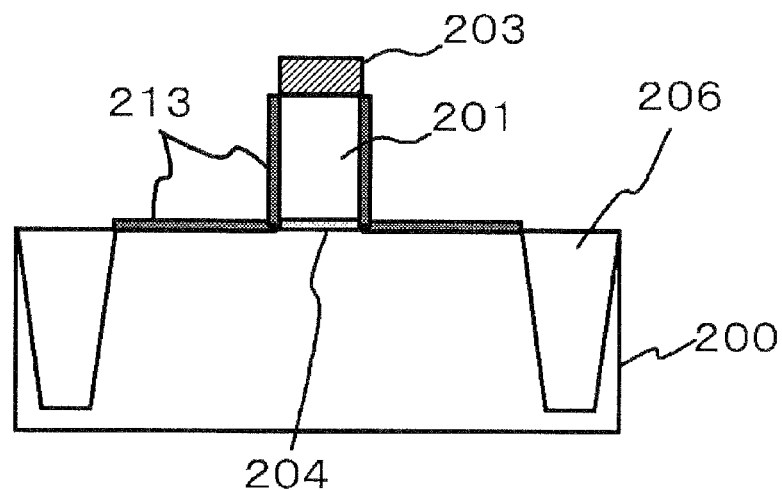
FIGS. 6A and 6B are cross-sectional views, sequentially showing a conventional process for manufacturing the semiconductor device.
Figure 6B:
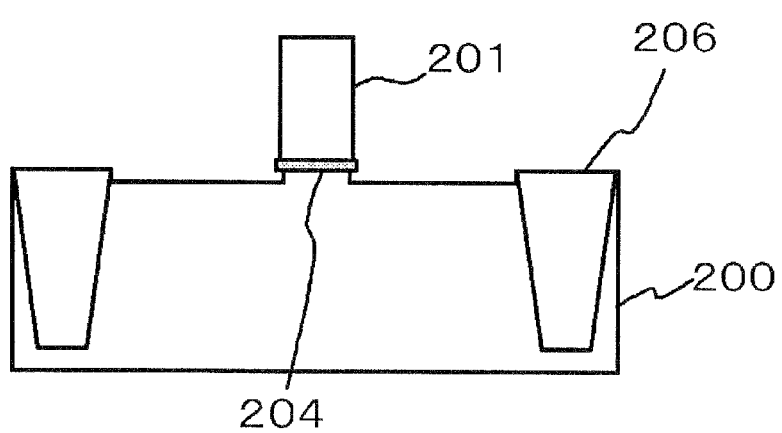

FIGS. 6A and 6B are cross-sectional views for performing the etching process for the silicon nitride film composing the hard mask 203 with an etching amount equivalent to 80 nm by only one cycle of a phosphate processing, without forming the first silicon oxide film and the second silicon oxide film. A one cycle of the etching of the silicon nitride film composing the hard mask 203 provides an etching of the silicon oxide film 213 by the etching amount equivalent to 2.0 nm, as a selectivity for silicon nitride film/oxide film is about 40. As shown in FIG. 6A, since the silicon substrate 200 and the silicon oxide film 213 on both side surfaces of the gate electrode 201 are chemically oxidized film or a native oxide film formed in the previous rinsing process, these films have a smaller thickness of about 1 nm, and therefore phosphoric acid aqueous solution is completely penetrated through the silicon oxide film 213. More specifically, since the silicon substrate 200 and the gate electrode 201 are exposed to phosphoric acid and a considerable over-etch is caused, the silicon substrate 200 and the gate electrode 201 are dug by the etching (FIG. 6B).

On the contrary, since the silicon substrate 200 and the side surfaces of the gate electrode 201 are protected with the first silicon oxide film 205 and the second silicon oxide film 208 until the silicon nitride film is completely etched off in the present embodiment, the "dug" in the surfaces of the silicon substrate 200 and the gate electrode 201 can be prevented.

Further, since the first silicon oxide film 205 is formed by a rapid thermal oxidation process at a temperature within a range of from 600 degree C. to 800 degree C. or a rinsing process, a migration an impurity through the gate insulating film to cause inhomogeneous channel impurity concentration can be prevented.

When the second silicon oxide film 208 is formed by a rapid thermal oxidation process at a temperature within a range of from 600 degree C. to 800 degree C., a migration an impurity through the gate insulating film to cause inhomogeneous channel impurity concentration can be prevented. By forming the second chemically oxidized film 208 by employing a chemical solution containing one selected from a group consisting of SPM, $H_2SO_4/O_3$ and ozone water, a high quality silicon oxide film having a fine oxide film quality can be formed, so that a sufficient etching allowance can be assured.

EXAMPLES

Example 1

Specimens were prepared in accordance with the first embodiment as shown with FIGS. 1A to 1D and FIGS. 2A to 2D. More specifically, the gate electrode 101 was formed on the silicon substrate 100 with the gate insulating film 104 (having film thickness of 1.0 to 1.5 nm) and polysilicon doped with phosphorus, and the dummy side wall 103 (first film) was formed on the gate electrode 101 through the dummy oxide film 102, and then an ion-implanting was performed on both sides of the dummy side wall 103 and an activation annealing is performed to form the source-drain region 107. Thereafter, an impurity was doped into the extension region 109, and then a silicide 111 was formed to provide a transistor. A specimen 1 is manufactured by the method of manufacturing the semiconductor device of first embodiment, and specimens 2, 3 and 4 are manufactured by the method for the semiconductor device as illustrated in the above description shown in FIGS. 3A to 3D and FIGS. 4A and 4B.

Figure 7:
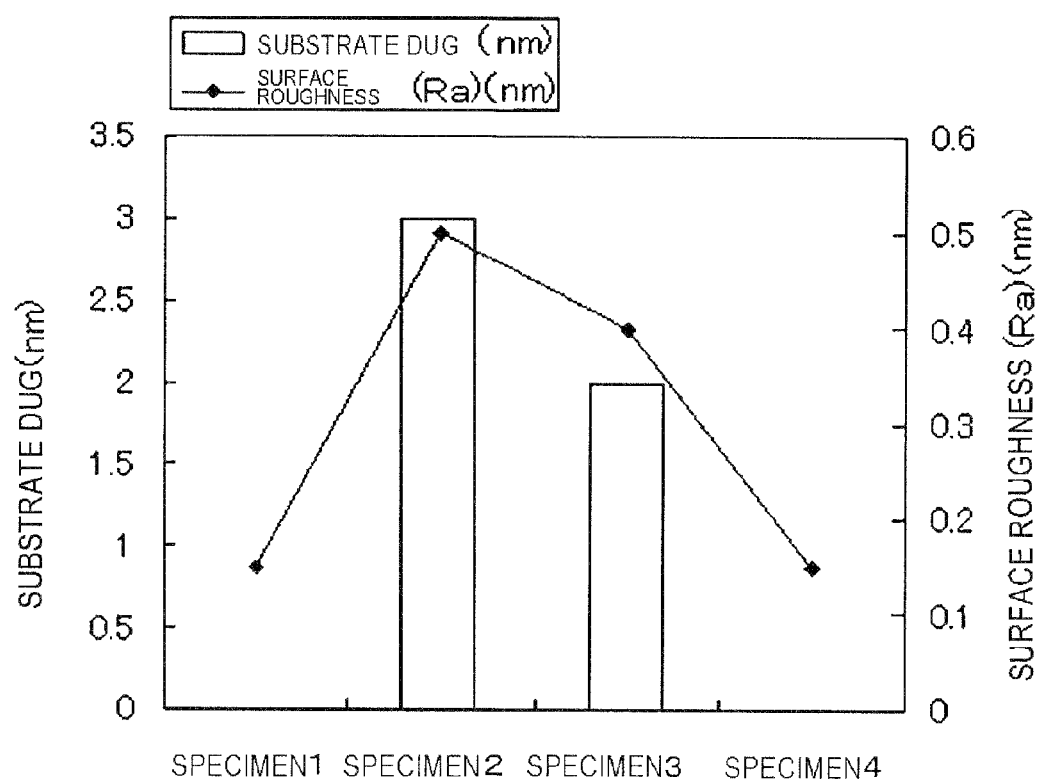
FIG. 7 is a graph, showing a comparison in a silicon substrate "dug" level and a surface roughness (Ra) between the method of manufacturing devices in first embodiment of the present invention and the conventional method.

The specimen 3 is different from the specimen 2 in view of employing a chemical solution of phosphoric acid additionally containing hydrogen peroxide in the process for etching the silicon nitride film, and the specimen 4 is different from the specimen 2 in view of forming a protective oxide film by a rapid thermal oxidation at a temperature of 850 degree C. shortly before of phosphate-processing for etching of the silicon nitride film. FIG. 7 is a graph showing the silicon substrate "dug" level and surface roughness (Ra) of the conventional technology. In comparison of the surface roughness (Ra) with the silicon substrate-"dug" with each specimen, better results were obtained in the specimen 1 and the specimen 4 on the silicon substrate "dug" and the surface roughness.

Figure 8:
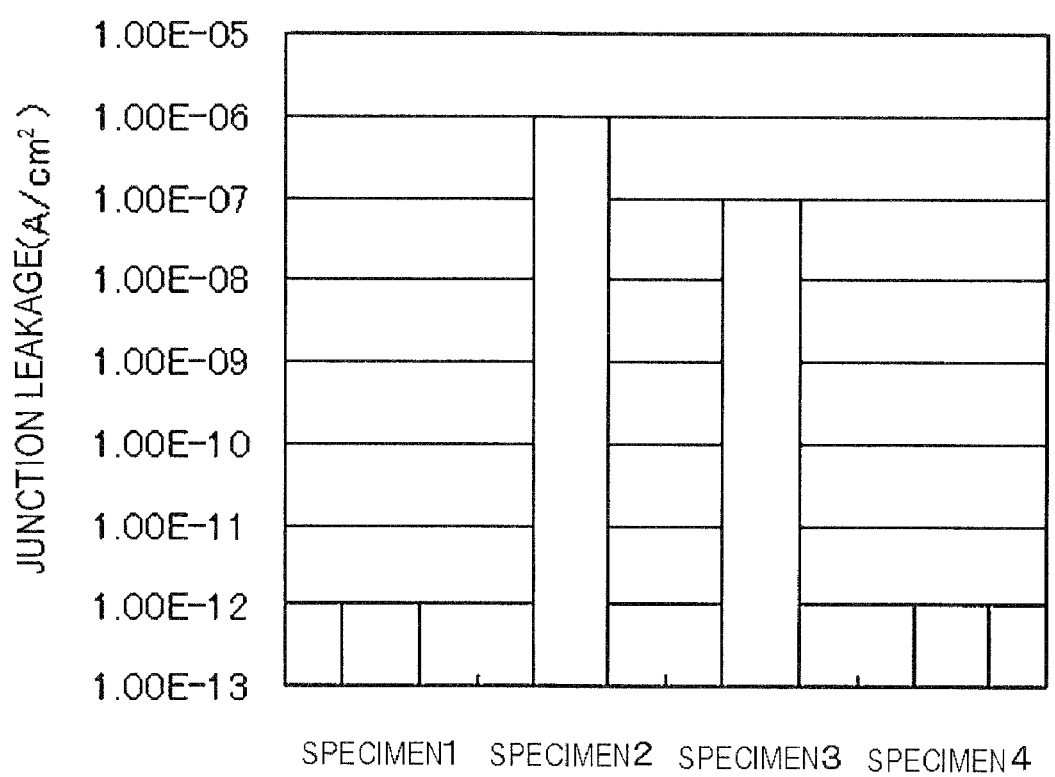
FIG. 8 is a bar graph, showing a comparison in junction leakage property for the set of transistors, which were manufactured in the same manufacturing process as employed in FIG. 7.

FIG. 8 is a graph, showing a comparison in junction leakage property among the same specimens, which were also employed in FIG. 7. The results concerning the unction leakage reflects the results concerning the silicon substrate "dug" and the surface roughness (Ra) as they are, and the results in the specimen 1 shows better junction leakage property.

The results in the specimen 4 concerning the junction leakage property exhibit the similar values as obtained in first embodiment. On the other hand, results reflecting influences of the thermal processing at higher temperature of not lower than 800 degree C. in other properties will be described.

Figure 9:
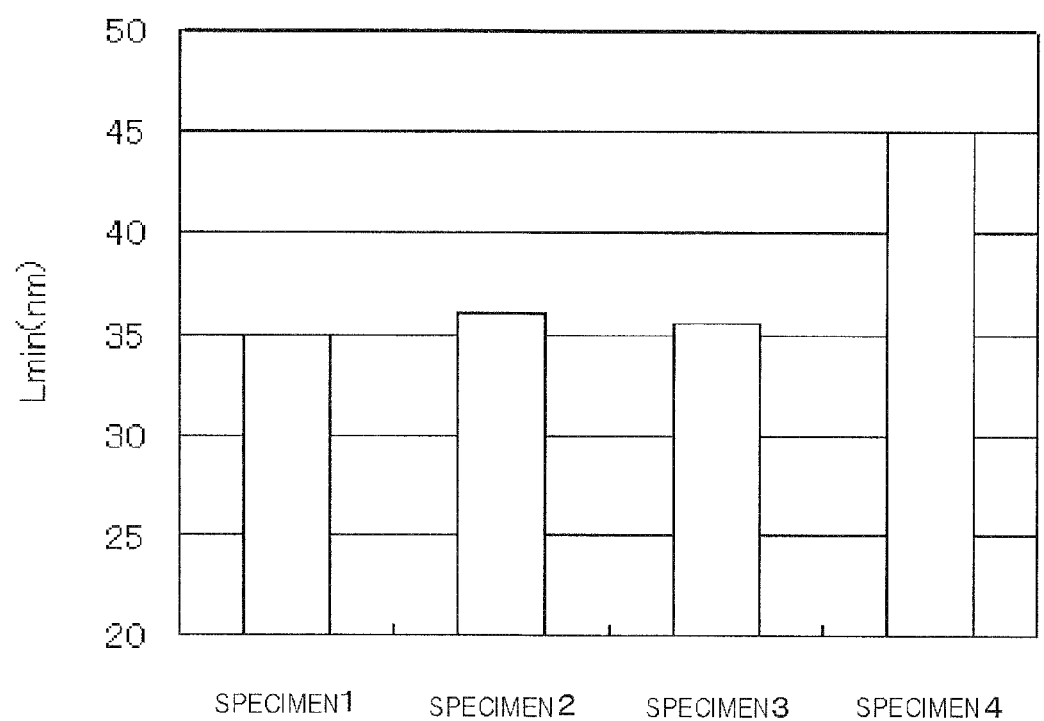
FIG. 9 is a bar graph, showing a comparison in Lmin for the set of transistors, which were manufactured in the same manufacturing process as employed in FIG. 7.

FIG. 9 is a graph, showing a comparison in Lmin with the set of specimens that were also employed in FIG. 7. As compared with the specimen 1 in first embodiment, Lmin in the specimen 4 is considerably deteriorated. This is because an impurity in the source-drain region of the specimen 4 diffuses toward the deeper direction by a thermal processing at higher temperature of not lower than 800 degree C. to provide deeper junction.

Example 2

A gate electrode was formed by the method of manufacturing the semiconductor device of second embodiment as illustrated in FIG. 5, and then a formation of an extension region, a formation of a side wall and a formation of a source-drain region were performed in this sequence to manufacture a transistor. More specifically, the gate insulating film 204 (film thickness 1.0 to 1.5 nm) was formed on the silicon substrate 200 through a mask of a silicon nitride film composing the hard mask 203, and then the gate electrode 201 was formed of polysilicon doped with phosphorus, and an impurity was doped into the extension (not shown), and then the side wall (not shown) was formed, and an impurity was doped into both sides of the side wall, and an activation annealing was performed to form the source-drain region (not shown).

Figure 10:
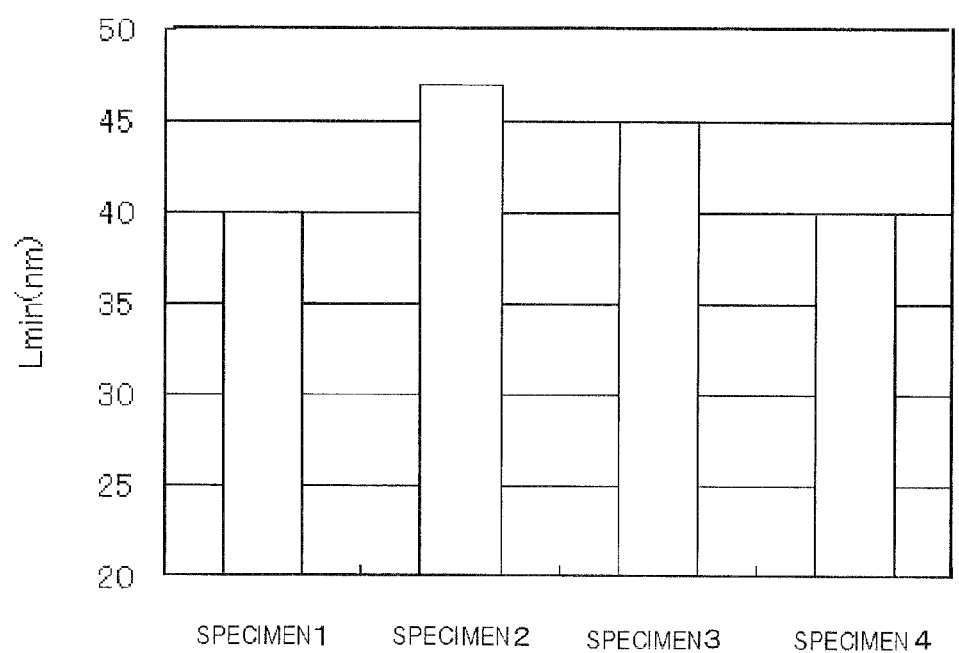
FIG. 10 is a bar graph, showing results of measured Lmin for set of transistors, which were manufactured in the manufacturing process as employed in second embodiment.

FIG. 10 is a graph, showing results of measured Lmin for specimens as employed in second embodiment. In the graph, the specimen 1 was manufactured by a manufacturing process in second embodiment, and the specimens 2, 3 and 4 were manufactured by forming the gate electrode by the method of manufacturing the semiconductor device as shown in FIG. 6; and then forming the extension region, the side wall, and the source-drain region similarly as for the specimen 1 to obtain the transistor. The specimen 3 is different from the specimen 2 in that a chemical solution containing hydrogen peroxide added in phosphoric acid was employed when the silicon nitride film of the hard mask 203 was etched, and the specimen 4 is different from the specimen 2 in that a protective oxide film was formed by a rapid thermal oxidation at 850 degree C. immediately before the processing with phosphate for etching the silicon nitride film. The results in the specimen 2 and specimen 3 exhibit deteriorations in Lmin. These were obtained due to a deeper junction depth by the generation of the substrate-dug and due to partially much thinner L dimension than the desired dimension by the "dug" of the side surface of the gate electrode.

The results in the specimen 4 concerning the deterioration of Lmin exhibit the similar values as obtained in second embodiment. On the other hand, results reflecting influences of the thermal processing at higher temperature of not lower than 800 degree C. in other properties will be described.

Figure 11:
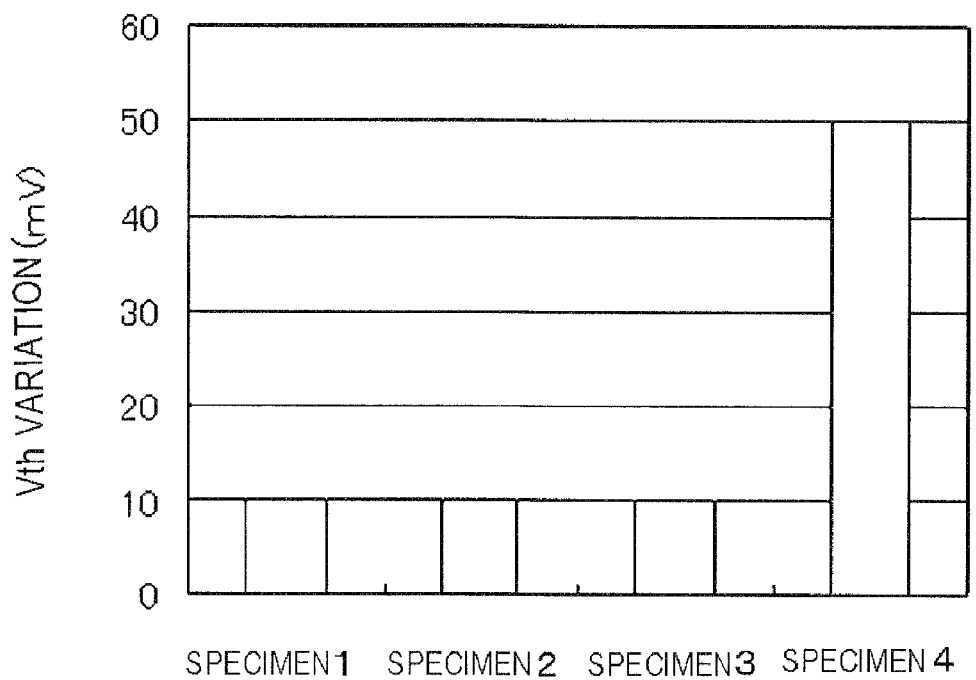
FIG. 11 is a bar graph, showing results of variation in wafer surface of threshold voltage Vth of the specimens employed in FIG. 10.
Figure 12:
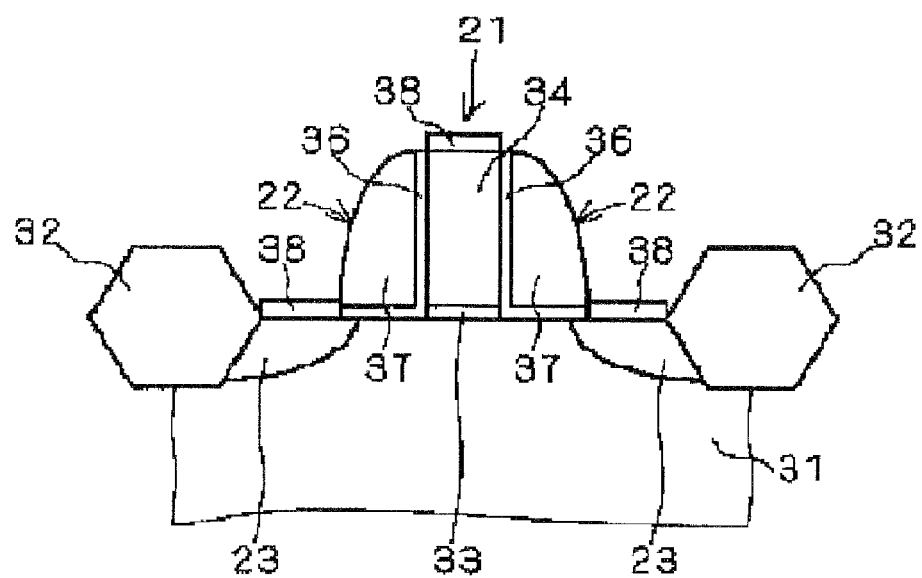
FIG. 12 is a cross-sectional view, useful in describing a conventional method of manufacturing a semiconductor device.

FIG. 11 is a graph, showing a variation in the threshold voltage Vth over the wafer surface of the specimen employed in FIG. 10. The specimens 1 to 4 are the same as specimens employed in FIG. 10. Concerning the variation in the threshold voltage Vth over the threshold voltage Vth, larger variation was observed for the specimen 4. This is because an impurity in the gate electrode penetrates through the gate insulating film during the thermal processing at higher temperature of not lower than 800 degree C. for protecting the oxide film formation to provide non-uniform channel impurity concentration.

The above-described results shows that, according to the method of manufacturing the semiconductor device of second embodiment, "dug" of the silicon substrate or the side surface of the gate electrode can be prevented, resulting in the reduced deterioration of Lmin and reduced variation in Vth.

It is intended that the method of manufacturing the semiconductor device according to the present invention is not limited to the above-described embodiments, and various modifications thereof are available. For example, while the silicon substrate is employed for the substrate in the above-described embodiments, the substrate may alternatively be silicon on insulator (SOI) substrate. Alternatively, the gate insulating film may be composed of silicon dioxide ($SiO_2$), silicon oxynitride (SiON), a high dielectric constant material (high-K) or the like. Further, the transistor structure of the present invention may also be applicable in Fin-FET.

It is apparent that the present invention is not limited to the above embodiment, and may be modified and changed without departing from the scope and spirit of the invention.

What is claimed is:

1. A method of manufacturing a semiconductor device, comprising:
    forming a gate electrode composed of polysilicon on a silicon substrate;
    forming a side wall composed of a first film on both side surfaces of said gate electrode;
    forming an impurity-diffused region in said silicon substrate on both sides of said side wall; and
    removing said side wall,
    wherein said removing the side wall includes:
        forming a first silicon oxide film by oxidizing an upper surface of said impurity-diffused region and an upper surface of said gate electrode;
        removing at least portions of said first film and said first silicon oxide film with a first chemical solution;
        forming a second silicon oxide film by oxidizing an upper surface of said impurity-diffused region and an upper surface of said gate electrode; and
        removing said first film and said second silicon oxide film with a second chemical solution.

2. The method of manufacturing the semiconductor device as set forth in claim 1, wherein said first film is a film containing nitrogen.

3. The method of manufacturing the semiconductor device as set forth in claim 1, wherein said forming the first silicon oxide film includes forming said first silicon oxide film by a rapid thermal oxidation process at a temperature within a range of from 600 degree C. to 800 degree C. or a rinsing process.

4. The method of manufacturing the semiconductor device as set forth in claim 1, wherein said forming the second silicon oxide film includes forming said second silicon oxide film by employing a chemical solution containing one selected from a group consisting of sulfuric acid hydrogen peroxide mixture (SPM), sulfuric acid ozone mixture (SOM: $H_2SO_4/O_3$) and ozone water.

5. The method of manufacturing the semiconductor device as set forth in claim 1, wherein said forming the second silicon oxide film includes forming said second silicon oxide film by a rapid thermal oxidation process at a temperature within a range of from 600 degree C. to 800 degree C.

6. A method of manufacturing a semiconductor device, comprising:
    forming a gate insulating film and a gate electrode film composed of polysilicon on a silicon substrate in this sequence, and forming a hard mask composed of a first film on said gate electrode film;
    selectively etching said gate insulating film and said gate electrode film by employing said hard mask to form a gate electrode; and
    removing said hard mask,
    wherein said removing the hard mask includes:
        forming a first silicon oxide film by oxidizing upper surfaces of regions and side surfaces of said gate electrode, except for an upper surface of said formed gate electrode having said first film;
        removing at least portions of said first film and said first silicon oxide film with a first chemical solution;
        forming a second silicon oxide film by oxidizing upper surfaces of regions and the side surfaces of said gate electrode, except for the upper surface of said formed gate electrode having said first film; and
        removing said first film and said second silicon oxide film with a second chemical solution.

7. The method of manufacturing the semiconductor device as set forth in claim 6, wherein said first film is a film containing nitrogen.

8. The method of manufacturing the semiconductor device as set forth in claim 6, wherein said forming the first silicon oxide film includes forming said first silicon oxide film by a rapid thermal oxidation process at a temperature within a range of from 600 degree C. to 800 degree C. or a rinsing process.

9. The method of manufacturing the semiconductor device as set forth in claim 6, wherein said forming the second silicon oxide film includes forming said second silicon oxide film by employing a chemical solution containing one selected from a group consisting of sulfuric acid hydrogen peroxide mixture (SPM), sulfuric acid ozone mixture (SOM: $H_2SO_4/O_3$) and ozone water.

10. The method of manufacturing the semiconductor device as set forth in claim 6, wherein said forming the second silicon oxide film includes forming said second silicon oxide film by a rapid thermal oxidation process at a temperature within a range of from 600 degree C. to 800 degree C.

* * * * *